United States Patent [19]

Skerlos et al.

[11] Patent Number: 4,598,425
[45] Date of Patent: Jul. 1, 1986

[54] ALL-CHANNEL TELEVISION TUNING SYSTEM

[75] Inventors: Peter C. Skerlos; Peter Strammello, Jr., both of Arlington Heights, Ill.

[73] Assignee: Zenith Electronics Corporation, Glenview, Ill.

[21] Appl. No.: 578,462

[22] Filed: Feb. 9, 1984

[51] Int. Cl.⁴ .......................... H04B 1/16; H03J 5/24
[52] U.S. Cl. .................................... 455/180; 455/188
[58] Field of Search ............. 455/188, 189, 190, 180, 455/191

[56] References Cited

U.S. PATENT DOCUMENTS 4,408,348 10/1983 Theriault ............................ 455/188
4,499,495 2/1985 Strammello ........................ 455/180

Primary Examiner—Marc E. Bookbinder
Assistant Examiner—Andrew J. Telesz

[57] ABSTRACT

An all-channel television tuner includes a single 75 ohm input for receiving airborne signals and CATV signals. A single band high frequency section tunes frequencies from 370 to 806 MHz and a three band low frequency section tunes frequencies from 54 MHz through 370 MHz. Both sections are coupled to the 75 ohm input through signal diverting means. A channel selector provides tuning voltages and band switching voltages to the sections and to the signal diverting means as a function of the channel selected.

9 Claims, 1 Drawing Figure

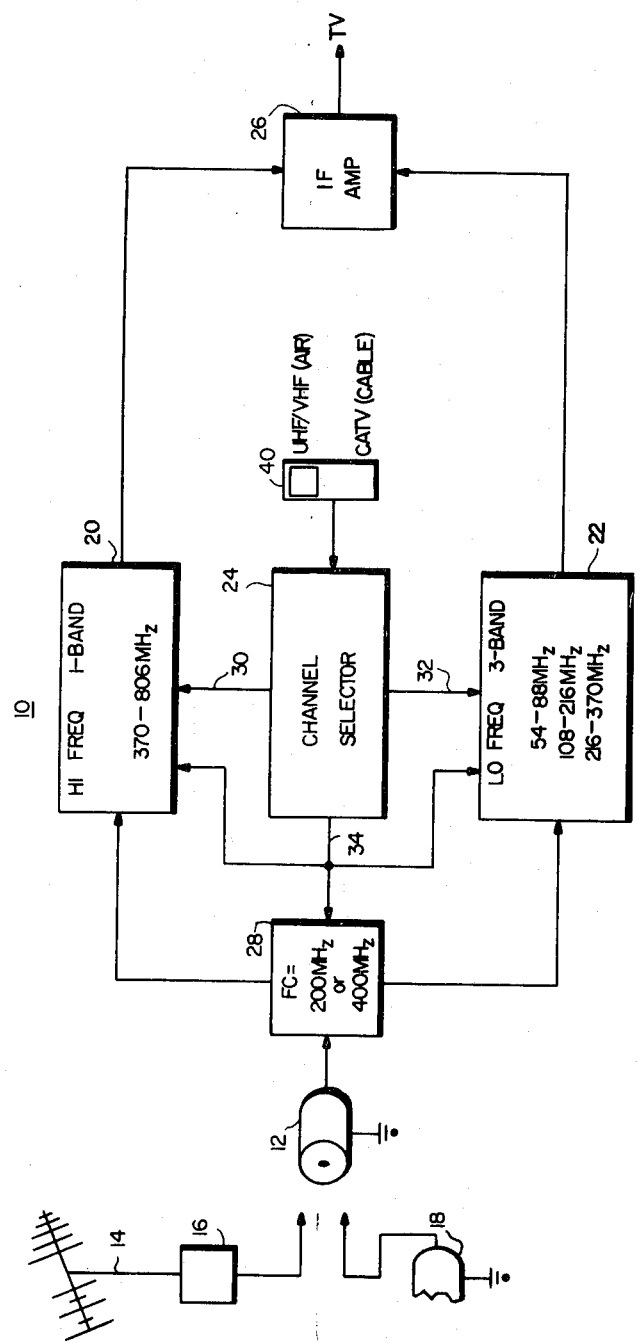

ALL-CHANNEL TELEVISION TUNING SYSTEM

CROSS REFERENCE TO RELATED APPLICATIONS

This application is related to subject matter disclosed and claimed in copending application Ser. No. 401,449, filed July 26, 1982, entitled Switching Diplexer for Single Antenna Input Television Receivers in the name of Peter Strammello, Jr. now U.S. Pat. No. 4,499,495 issued Feb. 12, 1985; and copending application Ser. No. 564,177, filed Dec. 22, 1983, entitled Dual Mode, UHF Tuning System in the name of Peter Skerlos, now U.S. Pat. No. 4,516,170 issued May 7, 1985; both of which are assigned to Zenith Electronics Corporation and both of which are hereby incorporated by reference.

BACKGROUND OF THE INVENTION AND PRIOR ART

This invention relates generally to tuning systems for television signals and specifically to an all-channel tuning system for tuning all over-the-air broadcast television signals and cable-connected television signals.

The broadcast television spectrum consists of 6 MHz wide channels in a plurality of disconnected frequency bands. These are commonly referred to as the VHF low and VHF high frequency bands, comprising channels 2 through 6 and 7 through 13 and covering 54 MHz through 88 MHz and 174 MHz through 260 MHz, respectively, and a UHF band covering channels 14 through 83 and extending from 470 MHz through 890 MHz.

The mechanisms for tuning these channels were initially large, cumbersome mechanical tuners that switched in different coil and capacitor combinations to attain the appropriate frequencies for television signal reception. A modern television tuner comprises a relatively simple electronic device having varactor diodes as the primary tuning control elements. The various coil arrangements used with the varactor diodes to tune the different frequency ranges are switched by so-called bandswitching diodes. As is well known, a varactor diode exhibits a capacitance which varies as a function of an applied DC tuning voltage. Since the amount of capacitance variation required to tune a circuit is primarily a function of the ratio between the highest and lowest frequencies involved, it is still necessary to bandswitch to embrace all of the so-called VHF frequencies. The UHF band, on the other hand, has generally been tunable with a single set of non-bandswitched tuned circuits.

The antenna structures used to receive VHF signals differ significantly from those used to receive UHF signals. In metropolitan areas, for example, UHF signals may be adequately received with a very small, low cost antenna structure, such as a "bow-tie" or a loop, whereas the VHF frequencies require a much larger structure, generally positioned outside at a high point such as on a rooftop. The bow-tie and loop are eminently suited to equally low cost 300 ohm impedance terminations, with the result that the UHF tuner has been universally supplied with a 300 ohm input impedance and as a separate structure entirely apart from the VHF tuner. Even with modern UHF/VHF electronic tuners, the historic 300 ohm UHF tuner section, like its forebear, has been retained as a separate structure.

In cable antenna television systems (CATV), cable operators are free from many of the FCC-imposed restrictions on television signal make-up. Since a cable-connected signal is not radiated into the air, use is made of the large frequency gap in the VHF signal spectrum between channels 6 and 7 and that existing between the upper end of the VHF spectrum, i.e., channel 13, and the lower end of the UHF spectrum, i.e., channel 14. For obvious reasons, cable operators generally selected frequencies compatible with existing receiver hardware. Television manufacturers, in turn, manufactured receivers for use with both air and cable signals. As the art developed, it became commonplace for VHF tuners to be used with converters for receiving cable-connected signals in much higher frequency bands and down-converting them to one of the VHF tuner channel positions, generally channel 3 or 4. Other developments occurred rapidly in which the VHF tuner ranges were extended to encompass the so-called CATV "midband", "superband" and "hyperband" frequencies. The upper limit on the hyperband has been steadily raised toward the lower end of the UHF spectrum. To avoid confusion it has been proposed to use the term "ultraband" for those CATV signals above the hyperband, which signals may encompass the UHF spectrum of frequencies.

Major advances have occurred with the use of microprocessor controlled tuning systems in television receivers. In such systems, tuning voltages and band signals for determining the appropriate set of tuned circuits, are stored in a memory that is generally accessed by the channel number. Systems of this type have been in use for a number of years and are well known in the art. While the channel selector means are significantly different, the tuning systems still incorporate a conventional 300 ohm UHF tuner for tuning signals in the UHF spectrum and either an additional VHF type tuner for tuning to CATV channels or an extended range VHF tuner which may have three or more different tuning bands for covering the VHF spectrum and the CATV midband, superband and hyperbands. A European television receiver has been marketed with a single 75 ohm input tuner with separate VHF and UHF sections of otherwise conventional design.

With the growing acceptance of CATV has come a commensurate need for additional CATV channels. UHF television stations, on the other hand, have suffered and have generally failed to develop markets equivalent to their VHF counterpart stations. Recently, FCC truncated the UHF spectrum beyond channel 69, thus removing about 80 MHz from the upper end of the UHF band. Despite this change, tuning systems continued to follow the prior art format of dual inputs, one for the VHF and low frequency CATV sections and one for the UHF section. The UHF tuner in the UHF section was, as it always has been, limited to tuning only broadcast UHF signals. The prior art solution to the growing need for additional CATV channel tuning capability failed to recognize the air and cable channel frequencies as a continuum and merely added additional bands of higher frequency VHF tuning or additional tuners for the CATV signals. The results were very expensive and complex mechanisms for "almost-all-channel" tuning. Thus the prior art failed to provide a tuning system for all 178 channels, both airborne and cable, and one which was sufficiently economical to be used in nearly all television receivers.

OBJECTS OF THE INVENTION

A principal object of this invention is to provide a novel all-channel (i.e., 178 channel) tuning system for a television receiver.

A further object of this invention is to provide a television tuning system capable of receiving all television channels in the broadcast and CATV frequency spectra.

SUMMARY OF THE INVENTION

In accordance with the invention an all-channel television tuner comprises a single band high frequency section and a multiband low frequency section, with both the sections together spanning the continuum of television cable and air channel frequencies. The tuner includes a common input terminal for receiving cable and airborne television signals and includes signal diverting means for directing input signals to said different sections.

BRIEF DESCRIPTION OF THE DRAWING

Further objects and advantages of the invention will be apparent upon reading the following description in conjunction with the drawing, the single figure of which is a block diagram of a tuning system constructed in accordance with the invention.

DESCRIPTION OF THE PREFERRED EMBODIMENT

The above-referenced copending application to Strammello, Jr. describes a novel, switchable, low-loss bandpass filter for directing signals in the upper portion of the CATV hyperband and beyond to a high frequency tuner section in response to an appropriate signal. Responsive to a similar signal, the switchable bandpass filter directs signals in the lower portion of the CATV hyperband and below to the low frequency tuning section. The simplicity and low cost of the switchable bandpass filter and its low-loss characteristics make it ideally suited for use in the novel tuning system of this invention in which the tuning sections have a common input. Signals are split approximately at the midpoint of the CATV hyperband with frequencies below the midpont going to the low frequency tuning section and frequencies above the midpoint going to the high frequency tuning section.

The above-referenced copending application of Skerlos is directed to a two mode high frequency tuning section, which in the CATV mode automatically produces frequencies that are offset by a given amount from the corresponding frequencies produced in the airborne mode. As is well known, when the television signal frequency bands were adopted, the channel frequencies were uniformly 6 MHz apart, but the frequency bands were not regularly spaced. CATV operators, whose cable signal frequencies are not rigidly assigned, may continuously fill in the available frequency spectrum with 6 MHz channels, in which case the channel frequencies in the CATV ultraband will not coincide with the channel frequencies in the airborne UHF band. In the tuning system of the copending application, a mode switch instructs the microprocessor tuning control to automatically compensate for the difference in channel frequencies between the CATV and airborne modes.

While the system of the present application may advantageously incorporate the inventions of these copending applications, it is specifically directed to the broad concept of a single input low cost, 178 channel television tuning system capable of receiving all CATV channels and all airborne channels.

Referring specifically to the block diagram, tuning system 10 includes a single, internal 75 ohm input connector 12 which is connectable to an antenna 14 for coupling received airborne television signals through a suitable transformer or balun 16, or to a 75 ohm cable input 18. The tuner includes a high frequency section 20, which may comprise a conventional UHF tuner tunable over a first frequency range without bandswitching occurring within, and a three band low frequency section 22 that is tunable over a second frequency range with bandswitching occurring within. The three "low frequency" bands are: 54 MHz through 88 MHz, 108 MHz through 216 MHz; and 216 MHz through 370 MHz. These bands thus embrace all airborne VHF channels and the CATV midband, superband and the lower portion of the CATV hyperband. The high frequency band extends from 370 MHz to 806 MHz, which covers not only the UHF airborne channels and the coextensive CATV ultraband, but also the upper portion of the CATV hyperband. The outputs of the high frequency and low frequency sections are supplied to an IF amplifier 26 for further processing by the remainder of the television receiver (not shown).

Signals from the common 75 ohm input terminal are supplied to signal diverting means 28, preferably in the form of a switchable bandpass filter like that disclosed in the copending Strammello, Jr. application. It will be appreciated that the common input terminal 12 is part of the tuner and thus internal to the television receiver. As indicated, the cutoff frequency fc of the bandpass filter is either 200 MHz or 400 MHz depending upon the band signal supplied thereto from the channel selector. A channel selector 24 supplies tuning voltages, over lines 30 and 32, to the high frequency section and low frequency section, respectively. Channel selector 24 also supplies band signals on output lead 34 for application to the separate tuning sections and to the signal diverting means. Channel selector 24 may also supply B+ operating potentials to the different tuning sections to selectively energize them, or portions thereof, as a function of the channel being tuned. For example, if a VHF signal is being tuned, the high frequency section may be disabled. Finally, a mode switch 40 is coupled to channel selector 24. Mode switch 40 includes two positions, one indicated as UHF/VHF (Air) and the other as CATV (Cable). It will be appreciated that mode switch 40 is not required to obtain the benefits of the broader aspects of the invention, but is useful in utilization of the invention of the copending Skerlos application.

The channel selector 24 is capable of being implemented in a number of different ways, with the microprocessor embodiment fully described in the copending Skerlos application being preferred. Suffice it to say that, upon selection of a channel, whether airborne or cable, a band signal potential for selecting operation of one of the four bands and a tuning voltage for tuning to the selected channel in that one band is developed by channel selector 24. These signals are applied to the tuning sections and to the signal diverting means. If the selected channel lies in the frequency range of bands 1–3, the low frequency tuning section is energized, the appropriate band is selected and the 400 MHz low pass cutoff characteristic is selected for signal diverting means 28. If either an airborne or CATV channel in the frequency range of band 4 is selected, high frequency tuning section 12 is energized and the cutoff frequency for signal diverting means 28 is changed to 200 MHz. Thus, the full gamut of television frequencies in the continuum of television cable and airborne channels is tunable by tuner 10, either via its low frequency section 22 or its high frequency section 20. Further, this highly desirable arrangement is achieved in a very efficient and cost-effective manner with components heretofore available in the prior art. Indeed, the individual varactor diodes in the tuner sections have been in commercial use for a number of years. The varactor diodes in the high frequency section are ITT type BB-329 and those in the low frequency are ITT type BB-221. In both sections the tuning voltages extend from 0.5 volts d.c. to 30 volts d.c.

While all of the elements have been available, they have not been configured in accordance with the invention concept to enable tuning of all 178 television channels in the CATV and airborne frequency spectra without expensive added tuning systems for the CATV hyperband.

What has been described is a novel tuner having a single input for tuning the continuum of television CATV and airborne frequencies. It is recognized that numerous modifications and changes in the described embodiment of the invention will be apparent to those skilled in the art without departing from the true spirit and scope thereof. The invention is to be limited only as defined in the claims.

What is claimed is:

1. An all-channel television tuner comprising:
   a high frequency section tunable over a first range of frequencies without bandswitching in said high frequency section;
   a low frequency section tunable over a second range of frequencies with bandswitching in said low frequency section, said high frequency and said low frequency sections together spanning a continuum of television cable and air channel frequencies covering all VHF, CATV and UHF channels;
   a common input terminal in said tuner for receiving said continuum of frequencies; and
   signal diverting means for directing incoming signals from said common input terminal to appropriate ones of said sections.

2. The tuner of claim 1 wherein said common input terminal has an input impedance of 75 ohms.

3. The tuner of claim 2 further including a channel selector for selecting channels in said continuum of frequencies; and
   wherein said signal diverting means is coupled to and operable under control of said channel selector.

4. The tuner of claim 3 wherein said continuum of frequencies includes a CATV superband and a CATV hyperband and wherein said high frequency section is a conventional UHF tuner with an extended low end operable for tuning the upper portion of said CATV hyperband as well as the air channel UHF frequencies.

5. The tuner of claim 4 wherein said low frequency section has three bands with the highest frequency band covering said CATV superband and a lower portion of the CATV hyperband.

6. An all-channel television tuner for tuning to a continuum of television cable and air channel frequencies covering all VHF, CATV and UHF channels, comprising:
   a high frequency section operable without bandswitching in said high frequency section for tuning the UHF airborne channel frequencies and the upper portion of CATV hyperband frequencies;
   a three band low frequency section operable with bandswitching in said low frequency section for tuning the VHF low and high frequencies, the CATV midband and superband frequencies and the lower portion of the CATV hyperband frequencies;
   a common 75 ohm input in said tuner;
   a channel selector for generating appropriate tuning voltages for tuning channels in said high frequency and said low frequency sections and for generating a band determining signal as a function of a channel selected; and
   signal diverting means coupled between said common input and said high and low frequency sections for directing input signal frequencies therebetween as a function of said band determining signal from said channel selector.

7. The tuner of claim 6 wherein said CATV hyperband is divided at approximately 370 MHz.

8. The tuner of claim 7 wherein said signal diverting means comprise a switchable bandpass filter with a movable cutoff frequency.

9. The tuner of claim 8 wherein said cutoff frequency for channels below 370 MHz is 400 MHz and for channels above 370 MHz is 200 MHz.

* * * * *